(12) United States Patent
Heo et al.

(10) Patent No.: US 11,614,565 B2
(45) Date of Patent: Mar. 28, 2023

(54) OPTICAL MULTILAYER FILM, AND OPTICAL COMPONENT AND DISPLAY DEVICE COMPRISING THE SAME

(71) Applicant: SKC CO., LTD., Gyeonggi-do (KR)

(72) Inventors: Young Min Heo, Gyeonggi-do (KR); Sechul Lee, Gyeonggi-do (KR); Seungwon Lee, Gyeonggi-do (KR)

(73) Assignee: SKC CO., LTD., Gyeonggi-do (KR)

( * ) Notice: Subject to any disclaimer, the term of this patent is extended or adjusted under 35 U.S.C. 154(b) by 508 days.

(21) Appl. No.: 16/506,661

(22) Filed: Jul. 9, 2019

(65) Prior Publication Data

US 2020/0012016 A1 Jan. 9, 2020

(30) Foreign Application Priority Data

Jul. 9, 2018 (KR) .................. 10-2018-0079263

(51) Int. Cl.
*G02B 1/111* (2015.01)
*G02B 5/30* (2006.01)
(Continued)

(52) U.S. Cl.
CPC ............ *G02B 1/111* (2013.01); *G02B 1/14* (2015.01); *G02B 5/3083* (2013.01); *G02F 1/133528* (2013.01); *H01L 51/0043* (2013.01); *H01L 51/5281* (2013.01); *C09K 2323/035* (2020.08); *H01L 2251/558* (2013.01)

(58) Field of Classification Search
CPC ........ G02B 1/111; G02B 1/14; G02B 5/3083; G02F 1/133528; H01L 51/5281; C09K 2323/035

See application file for complete search history.

(56) References Cited

U.S. PATENT DOCUMENTS

2001/0021446 A1\* 9/2001 Takematsu ............. G02B 1/113
428/220
2005/0008863 A1\* 1/2005 Mimura ................... G02B 1/11
428/409

(Continued)

FOREIGN PATENT DOCUMENTS

| CN | 1558824 A | 12/2004 |
| CN | 102576094 A | 7/2012 |

(Continued)

OTHER PUBLICATIONS

Office Action issued by Japanese Patent Office dated Jul. 21, 2020.
(Continued)

*Primary Examiner* — Sophie Hon
*Assistant Examiner* — Sow-Fun Hon
(74) *Attorney, Agent, or Firm* — IP & T Group LLP

(57) ABSTRACT

The optical multilayer film, which comprises a laminate in which a base layer, a primer layer, a hard coat layer, a first refractive layer, and a second refractive layer are sequentially laminated, has a very low reflectance and enhanced optical characteristics by adjusting the in-plane retardation (Continued)

of the base layer and the refractive indices of the respective layers. Thus, the optical component and the display device, which comprise the optical multilayer film, have a low reflectance and excellent other optical characteristics.

13 Claims, 6 Drawing Sheets

(51) Int. Cl.
  *G02B 1/14* (2015.01)
  *H01L 51/52* (2006.01)
  *H01L 51/00* (2006.01)
  *G02F 1/1335* (2006.01)

(56) References Cited

U.S. PATENT DOCUMENTS

| | | | | |
|---|---|---|---|---|
| 2010/0108957 A1* | 5/2010 | Ishida | ................ | C09B 23/0025 |
| | | | | 252/582 |
| 2010/0220266 A1* | 9/2010 | Kashima | ........... | G02F 1/133528 |
| | | | | 349/96 |
| 2013/0139883 A1* | 6/2013 | Togawa | ................... | C09D 5/00 |
| | | | | 136/256 |
| 2016/0308170 A1* | 10/2016 | Kim | .................... | H01L 51/5281 |

FOREIGN PATENT DOCUMENTS

| | | | | | |
|---|---|---|---|---|---|
| CN | 105313391 | A | | 2/2016 | |
| CN | 110764177 | B | * | 6/2022 | ................ C08J 5/18 |
| JP | 2005-041205 | A | | 2/2005 | |
| JP | 2008-003359 | A | | 1/2008 | |
| JP | 2008-116597 | A | | 5/2008 | |
| JP | 2010-244059 | | | 10/2010 | |
| JP | 4962661 | | | 6/2012 | |
| KR | 10-1730854 | B1 | * | 4/2017 | ............... G02B 5/30 |
| KR | 102032316 | B1 | * | 10/2019 | ............... C08J 5/18 |
| TW | I710788 | B | * | 11/2020 | ............... C08J 5/18 |
| WO | 2017/209473 | A1 | | 12/2014 | |

OTHER PUBLICATIONS

Office Action issued by China National Intellectual Property Administration dated Mar. 25, 2021 for Chinese Patent Application No. 201910614871.5.

Pre-Appeal Examination Report issued in corresponding Japanese Patent Application No. 2019-127711, dated Aug. 12, 2021, 6 pages.

* cited by examiner

[Fig. 1]
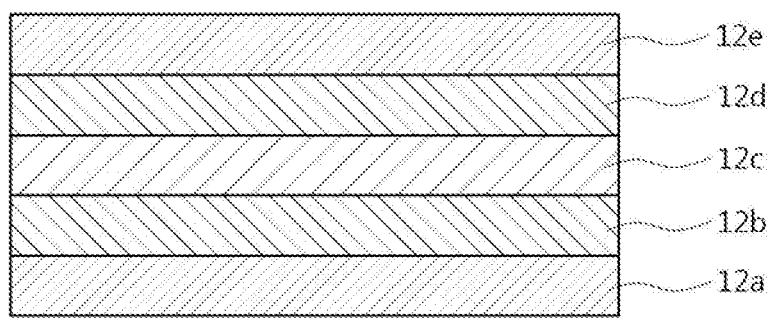
[Fig. 2]
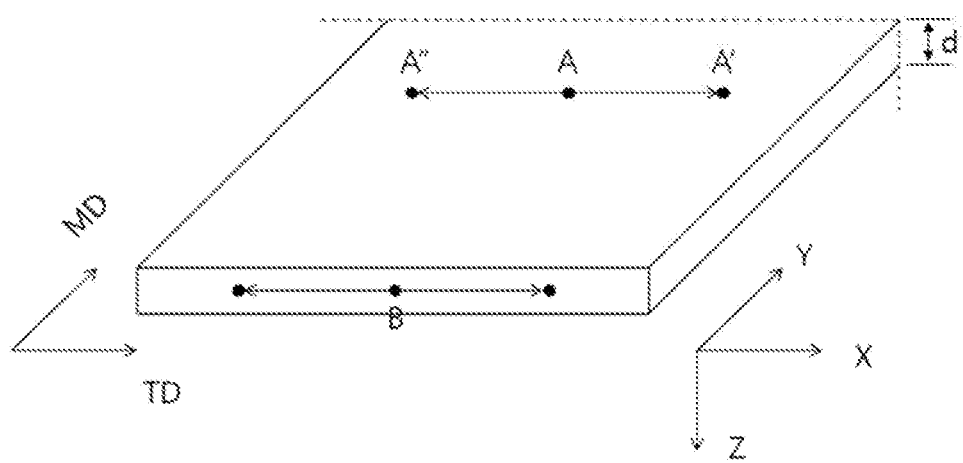

[Fig. 3a]
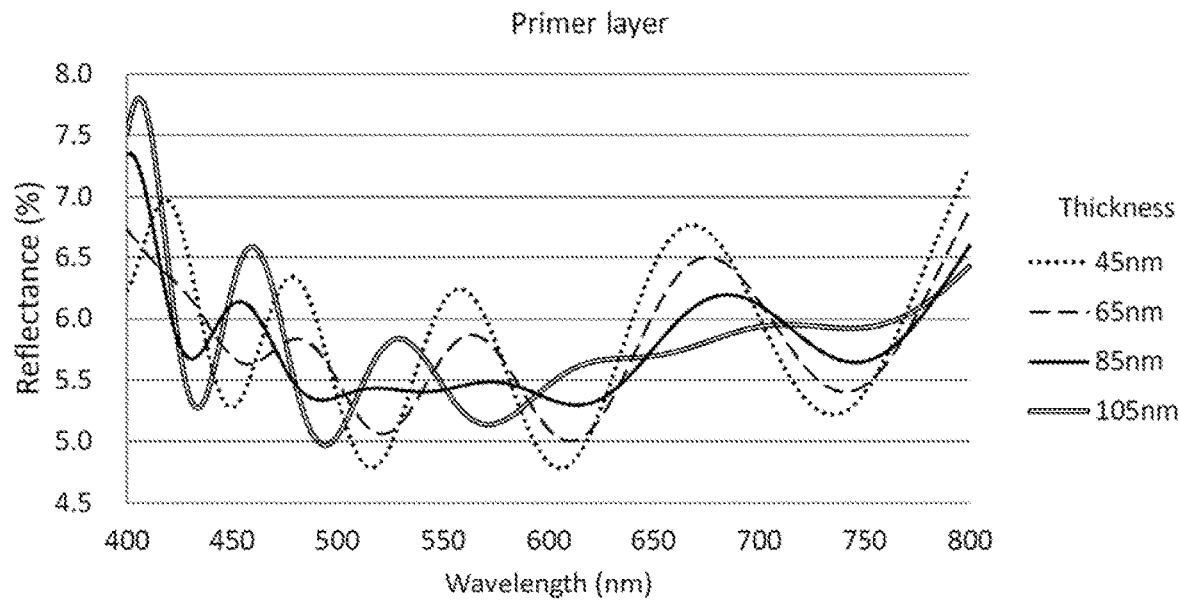
[Fig. 3b]
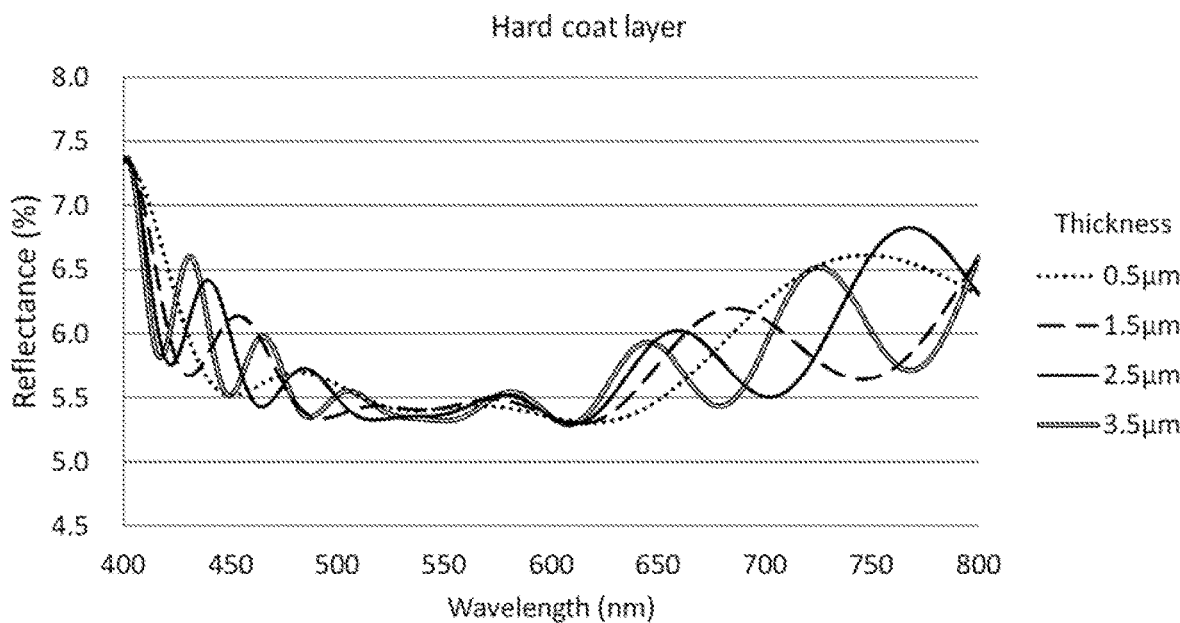

[Fig. 3c]
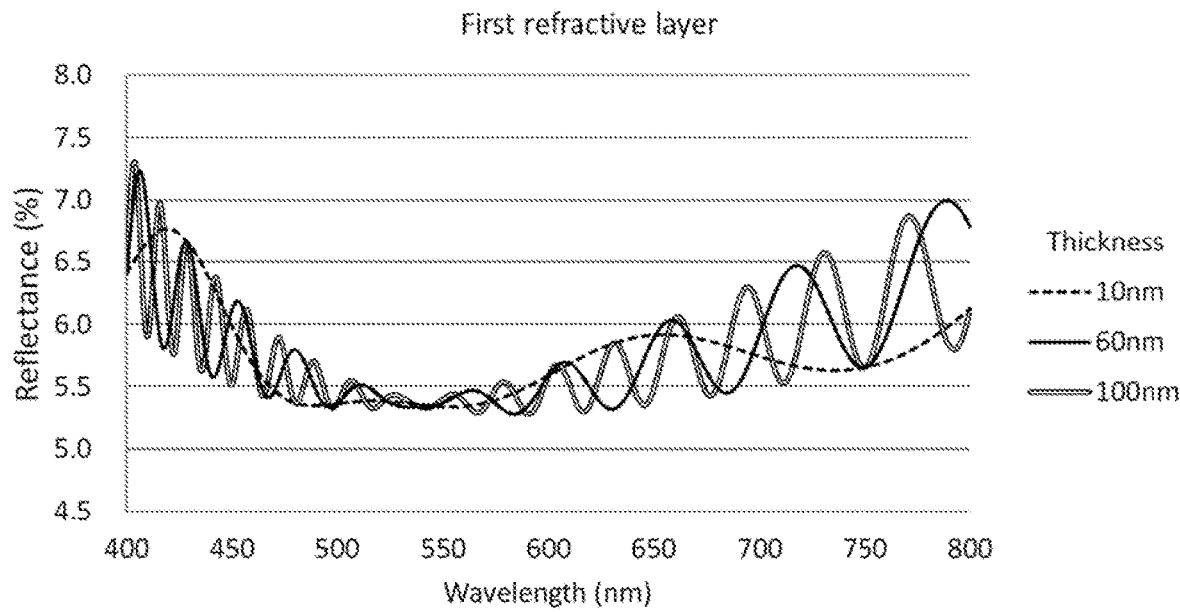
[Fig. 3d]
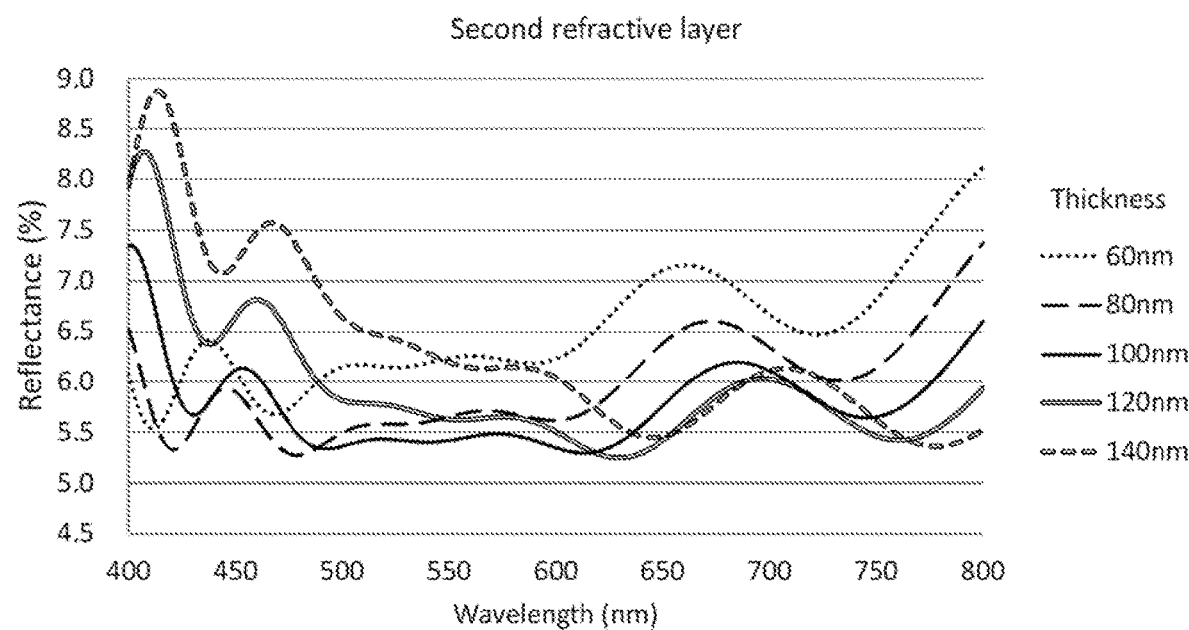

[Fig. 4a]
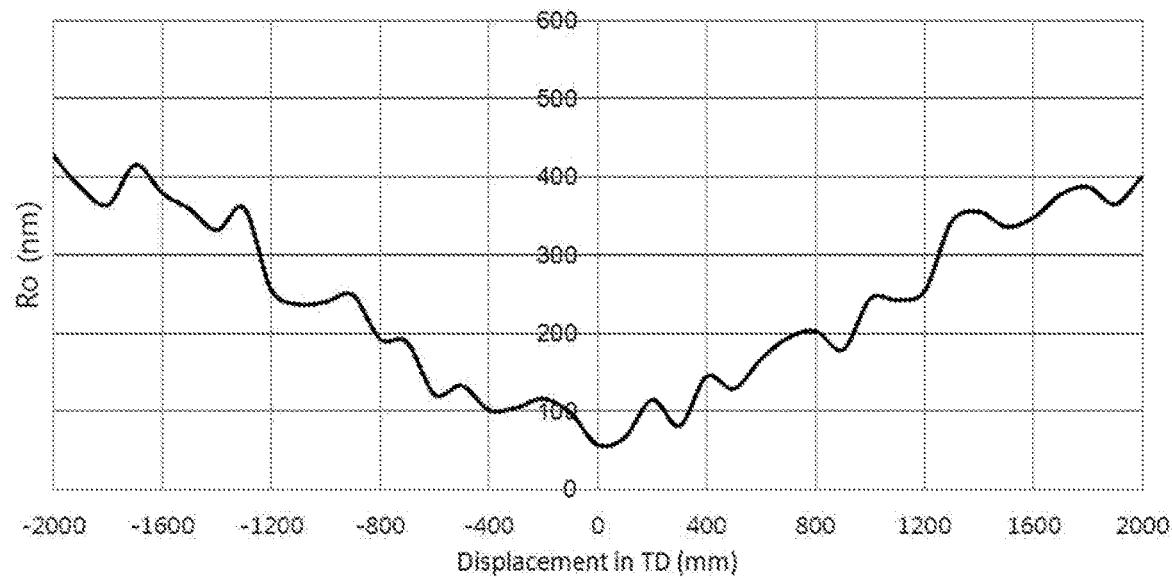
[Fig. 4b]
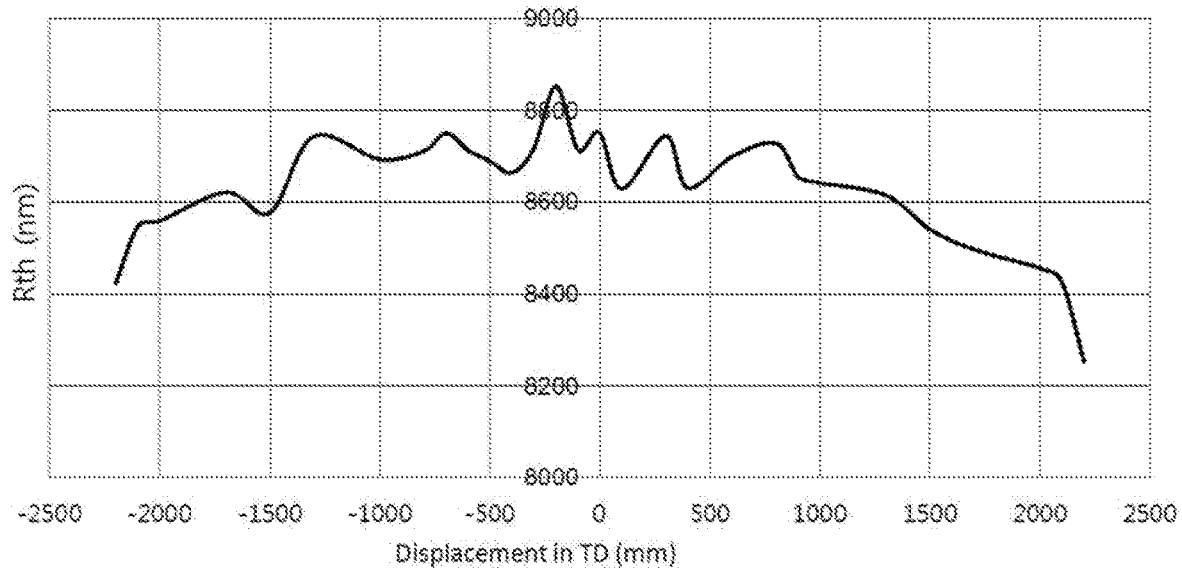

[Fig. 5]
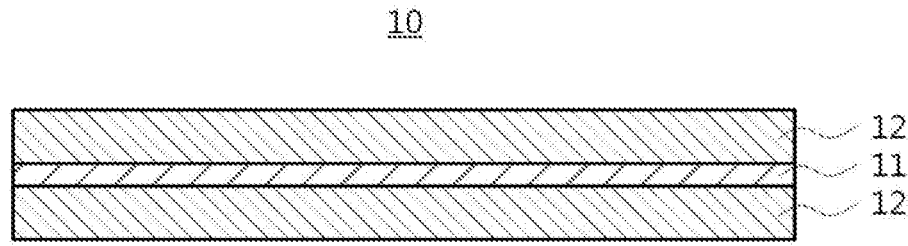
[Fig. 6]
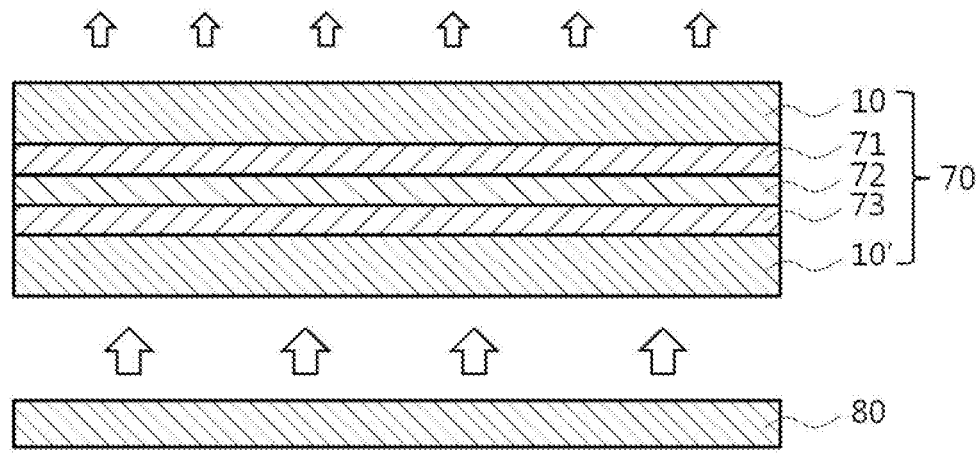
[Fig. 7]
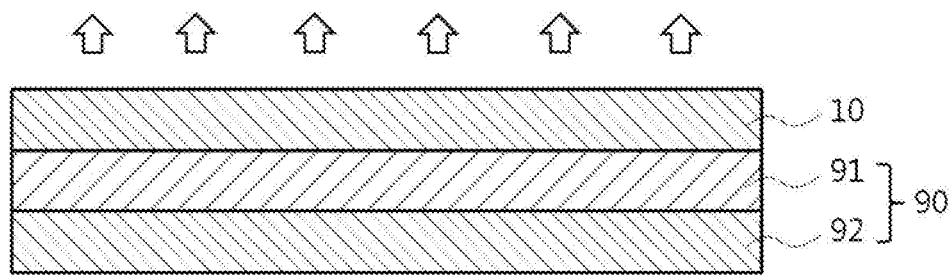

[Fig. 8]
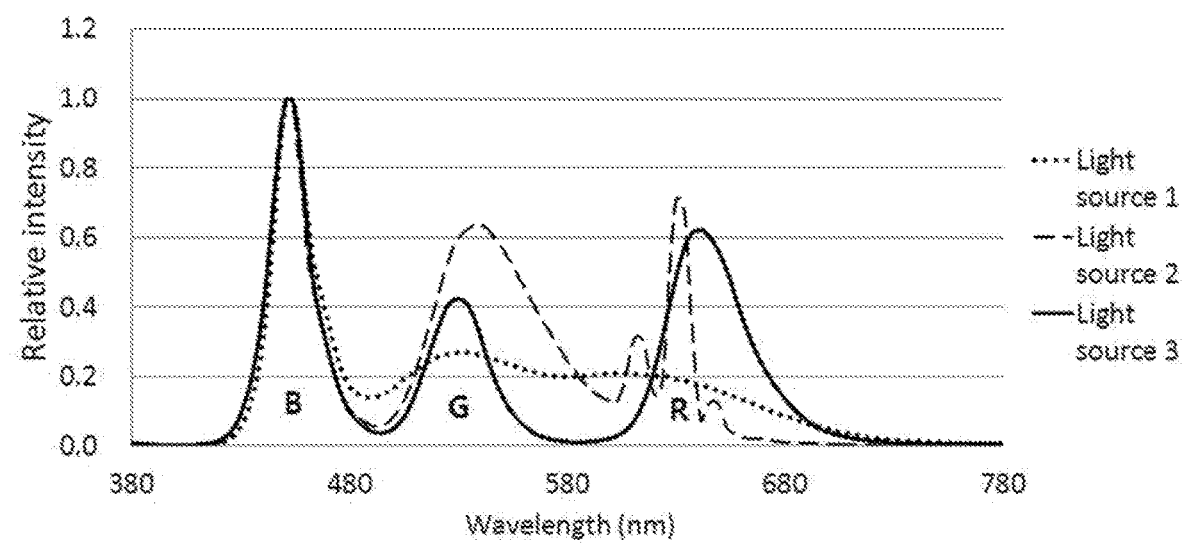

OPTICAL MULTILAYER FILM, AND OPTICAL COMPONENT AND DISPLAY DEVICE COMPRISING THE SAME

The present application claims priority of Korean patent application number 10-2018-0079263 filed on Jul. 9, 2018, which is incorporated herein by reference in its entirety.

TECHNICAL FIELD

Embodiments relate to an optical multilayer film having an ultra-low reflection characteristic and an optical component and a display device comprising the same.

BACKGROUND ART

In recent years, as the demand for liquid crystal displays (LCDs) has rapidly increased, an interest in a polarizing plate, which is one of the essential components thereof, is also increasing. A polarizing plate acts to polarize incident natural light vibrating in various directions to light vibrating in one direction. It is an essential component for providing a constant transmitted light and changing the color tone of the transmitted light.

A polarizing plate has a structure in which a protective film is laminated on one side or both sides of a polarizer. In such event, a polyvinyl alcohol (PVA) film is mainly used as the polarizer. In addition, a triacetyl cellulose (TAC) film is mainly used as the protective film.

A TAC film is optically isotropic with controlled retardation and has the advantages of a high transmittance and a defectless surface. However, a TAC film is disadvantageous in that its degree of polarization is deteriorated when used for a long period of time in an environment of high temperature and high humidity because it is 25 vulnerable to heat and humidity and that its durability is low due to the occurrence of, e.g., a light leakage phenomenon, which is excessive leakage of light at the edges caused by the degradation by moisture.

Meanwhile, as the functions and uses of liquid crystal displays (LCDs) become diverse, it is demanded that they can operate normally even in harsh environments. Recently, attempts have been made to replace a TAC film with a polyester film as suggested in Japanese Laid-open Patent Publication Nos. 2011-532061 and 2010-118509. In particular, polyethylene terephthalate (PET) films, which are excellent in mechanical properties, chemical resistance, water barrier properties, and the like, may meet this demand.

In addition, in recent years, various surface treatment techniques have been developed to minimize the reflectance of optical films attached to the front side of a display device in order to prevent that the visibility is lowered by the reflection of external light from the front side of the display device.

DISCLOSURE OF INVENTION

Technical Problem

There is known a method of forming various functional layers on the surface of an optical multilayer film in order to lower the reflectance of the optical film employed in a display device. However, the functional layers to be newly formed cause optical interference with the existing film layers, which makes it difficult to control the reflectance or deteriorates the optical characteristics.

In addition, a polyester film made of, e.g., polyethylene terephthalate has a very large birefringence. Thus, the polarizing state is distorted between the polarizer and the liquid crystal, resulting in rainbow strains or the like, which significantly impairs the visibility.

Accordingly, it is intended through the following embodiments to provide an optical multilayer film, which has a very low reflectance and is excellent in other optical characteristics, an optical component comprising the same, and a display device provided with the same.

Solution to Problem

According to one embodiment, there is provided an optical multilayer film, which comprises a laminate in which a base layer, a primer layer, a hard coat layer, a first refractive layer, and a second refractive layer are sequentially laminated, wherein the base layer comprises a polyester resin and has an in-plane retardation (Ro) of 0 to 500 nm, and when the refractive indices of the base layer, the primer layer, the hard coat layer, the first refractive layer, and the second refractive layer are n1, n2, n3, n4, and n5, they satisfy the following Equations (1) to (4):

$$1.61 \leq n1 \leq 1.69 \tag{1}$$

$$n5 < n3 < n2 < n1 < n4 \tag{2}$$

$$0.05 \leq n1 - n3 \leq 0.20 \tag{3}$$

$$0.30 \leq n4 - n5 \leq 0.60 \tag{4}$$

According to another embodiment, there is provided an optical component, which comprises a polarizer and the optical multilayer film disposed on at least one side of the polarizer.

According to still another embodiment, there is provided a display device, which comprises a display panel and the optical component disposed on at least one of the upper and lower sides of the display panel.

Advantageous Effects of Invention The optical multilayer film according to the embodiment has a very low reflectance, so that the visibility is not impaired by external light. In addition, in the optical multilayer film, the base layer has a very low in-plane retardation, and the refractive index thereof may be combined with those of other constituent layers to enhance the optical characteristics. Accordingly, the optical component and the display device provided with the optical multilayer film according to the embodiments can have a low reflectance, excellent optical properties, and enhanced physical properties.

BRIEF DESCRIPTION OF DRAWINGS

FIG. 1 shows a cross-sectional view of an optical multilayer film according to one embodiment.

FIG. 2 is a schematic diagram for explaining a displacement in the transverse direction of a film and the width center thereof.

FIGS. 3a to 3d are the results of measuring the reflectance (%) with respect to the wavelength (nm) while the thicknesses of a primer layer, a hard coat layer, a first refractive layer, and a second refractive layer are changed, respectively.

FIGS. 4a and 4b are the results of measuring the in-plane retardation (Ro) and the thickness direction retardation (Rth) in the overall effective width for various base layers, respectively.

FIG. 5 is a cross-sectional view of a polarizing plate according to one embodiment.

FIG. 6 is a cross-sectional view of a liquid crystal display device according to one embodiment.

FIG. 7 is a cross-sectional view of an organic electroluminescent display device according to one embodiment.

FIG. 8 illustrates the spectra of various light sources applied to a backlight unit of a liquid crystal display device.

| Reference Numerals of the Drawings | |
|---|---|
| 10: (upper) polarizing plate | 10': (lower) polarizing plate |
| 11: polarizer | 12: optical multilayer film |
| 12a: base layer | 12b: primer layer |
| 12c: hard coat layer | 12d: first refractive layer |
| 12e: second refractive layer | 70: liquid crystal panel |
| 71: color filter substrate | 72: liquid crystal layer |
| 73: TFT substrate | 80: backlight unit |
| 90: organic electroluminescent panel | |
| 91: organic electroluminescent substrate | |
| 92: driving substrate | |
| A, B: width center | d: thickness |
| A', A'', B', B'': displacement from the width center | |

BEST MODE FOR CARRYING OUT THE INVENTION

Throughout the description of the embodiments, in the case where each film, panel, or layer is mentioned to be formed "on" or "under" another film, panel, or layer, it means not only that one element is directly formed on or under another element, but also that one element is indirectly formed on or under another element with other element(s) interposed between them.

In addition, for the sake of description, the sizes of individual elements in the appended drawings may be exaggeratingly depicted and do not indicate the actual sizes.

In addition, all numerical ranges related to the physical properties, dimensions, and the like of a component used herein are to be understood as being modified by the term "about," unless otherwise indicated.

Optical Multilayer Film

FIG. 1 shows a cross-sectional view of an optical multilayer film according to one embodiment.

Referring to FIG. 1, the optical multilayer film (12) according to one embodiment comprises a laminate in which a base layer (12a), a primer layer (12b), a hard coat layer (12c), a first refractive layer (12d), and a second refractive layer (12e) are sequentially laminated, wherein the base layer comprises a polyester resin and has an in-plane retardation (Ro) of 0 to 500 nm, and when the refractive indices of the base layer, the primer layer, the hard coat layer, the first refractive layer, and the second refractive layer are n1, n2, n3, n4, and n5, they satisfy the following Equations (1) to (4).

$$1.61 \leq n1 \leq 1.69 \quad (1)$$

$$n5 < n3 < n2 < n1 < n4 \quad (2)$$

$$0.05 \leq n1 - n3 \leq 0.20 \quad (3)$$

$$0.30 \leq n4 - n5 \leq 0.60 \quad (4).$$

Reflectance

The optical multilayer film has a very low reflectance with respect to visible light.

For example, the optical multilayer film may have a reflectance of 6.5% or less with respect to light having a wavelength of 550 nm. Specifically, the optical multilayer film may have a reflectance of 6% or less, 5.5% or less, or 5% or less with respect to light having a wavelength of 550 nm. More specifically, it may have a reflectance in a range of 1% to 6.5°%, in a range of 3% to 6.5%, or in a range of 5% to 6.5%. Thus, the optical multilayer film has little reflection of external light, whereby the visibility can be enhanced.

Retardation of the Base Layer

The base layer has an in-plane retardation (Ro) of 0 to 500 nm. Specifically, the in-plane retardation of the base layer may be 0 to 400 nm, 0 to 300 nm, or 0 to 200 nm. In particular, the base layer may have a minimum in-plane retardation ($Ro_{min}$) of 150 nm or less, 120 nm or less, 100 nm or less, 85 nm or less, 75 nm or less, or 65 nm or less. Within the above range, the occurrence of rainbow stains can be minimized.

Meanwhile, the lower limit of the in-plane retardation may be 10 nm or more, 30 nm or more, or 50 nm or more in order to balance the optical characteristics and the mechanical properties.

In addition, the base layer may have a thickness direction retardation (Rth) of 5,000 nm or more or 5,500 nm or more. In particular, the base layer may have a maximum thickness direction retardation ($Rth_{max}$) of 6,000 nm or more, for example, 6,500 nm or more, for example, 7,500 nm or more, for example 8,000 nm or more, for example 8,500 nm or more.

The thickness direction retardation may be a value measured based on a thickness of 40 μm to 50 μm. Within the above range, the degree of orientation of molecules is high, which promotes the crystallization and is preferable from the viewpoint of mechanical properties. In addition, as the thickness direction retardation (Rth) is larger, the ratio (Rth/Ro) of the thickness direction retardation (Rth) to the in-plane retardation (Ro) becomes larger, thereby effectively suppressing rainbow stains.

Meanwhile, the upper limit of the thickness direction retardation (Rth) may be 16,000 nm or less, 15,000 nm or less, or 14,000 nm or less in view of the thickness limit and cost for eliminating rainbow stains in the optical multilayer film.

The in-plane retardation (Ro) is a parameter defined by a product (ΔNxy×d) of the anisotropy (ΔNxy=|Nx−Ny|) of refractive indices of two mutually perpendicular axes (see FIG. 2) in the plane of a film and the film thickness d (nm), which is a measure of the degree of optical isotropy and anisotropy. In addition, the minimum in-plane retardation ($Ro_{min}$) refers to the lowest value when the in-plane retardation (Ro) is measured at a plurality of points in the plane of a film.

In addition, the thickness direction retardation (Rth) is a parameter defined by a product of an average of the two birefringences ΔNxz (=|Nx−Nz|) and ΔNyz (=|Ny−Nz|) observed on a cross-section in the film thickness direction and the film thickness d (nm). In addition, the maximum thickness direction retardation ($Rth_{max}$) refers to the highest value when the thickness direction retardation (Rth) is measured at a plurality of points in the plane of a film.

According to a process for preparing a film according to one embodiment, the minimum in-plane retardation and the maximum thickness direction retardation may be shown at the width center of a film. Thus, the minimum in-plane retardation and the maximum thickness direction retardation of a film may be a value measured at the width center of the film. The "width center" as used herein may be defined as the middle point (A, B) of the width of a film after the film has been stretched in the transverse direction (TD) and the longitudinal direction (MD) as shown in FIG. 2. The film is not limited to have only one width center, but it can have unlimited ones according to the measurement points. Meanwhile, the width center of a film finally cut to various shapes after the preparation thereof may not match the width center of the original film (i.e., the film before cutting). In such event, the minimum in-plane retardation and the maximum thickness direction retardation may not be shown at the width center of the film.

In addition, when a film is applied to optical components for large-screen applications, it is preferable that the deviation of the in-plane retardation (that is, the difference between the maximum value and the minimum value) within the effective width is small. Here, the effective width refers to the distance between points (A' and A") that are displaced in a certain distance toward both ends along the transverse direction (i.e., x-axis) from the width center (A) as shown in FIG. 2. For example, it may be defined as ±1,500 mm from the width center, i.e., about 3,000 mm. Meanwhile, as described above, the width center of a film finally cut to various shapes after the preparation thereof may not match the width center of the original film (i.e., the film before cutting). In such event, the effective width can be defined as the distance between points that are displaced in a certain distance toward both ends along the transverse direction from the point where the minimum in-plane retardation is shown on a film.

The base layer has a small variation in the in-plane retardation within the effective width. For example, the base layer may have a change ($|\Delta Ro|/|\Delta x|$) in the in-plane retardation with respect to a displacement in the transverse direction is less than 550 nm/3 m, for example, less than 450 nm/3 m, for example, less than 350 nm/3 m, for example, less than 300 nm/3 m. Here, the displacement ($\Delta x$) in the transverse direction refers to the distance ($x_2-x_1$) between certain points on the transverse direction (i.e., x-axis). The change ($\Delta Ro$) in the in-plane retardation refers to the difference ($Ro_2-Ro_1$) in the in-plane retardations at the respective certain points. Within the above range, the in-plane retardation (Ro) does not significantly increase even when the width of the film is widened. Thus, it is possible to effectively prevent rainbow strains.

In addition, the base layer has a small variation in the thickness direction retardation within the effective width. Specifically, the base layer may have a change ($|\Delta Rth|/|\Delta x|$) in the thickness direction retardation with respect to a displacement in the transverse direction of less than 1,000 nm/3 m, less than 700 nm/3 m, or less than 500 nm/3 m. Here, the displacement ($\Delta x$) in the transverse direction refers to the distance ($x_2-x_1$) between certain points on the transverse direction (i.e., x-axis). The change ($\Delta Rth$) in the thickness direction retardation refers to the difference ($Rth_2-Rth_1$) in the thickness direction retardations at the respective certain points.

In addition, the base layer may have a ratio (Rth/Ro) of the thickness direction retardation (Rth) to the in-plane retardation (Ro) of 10 or more, 15 or more, or 20 or more. The smaller the in-plane retardation (Ro) and the larger the thickness direction retardation (Rth), the more advantageous to preventing rainbow stains. Thus, it is preferable that the ratio (Rth/Ro) of the two values is maintained to be larger.

In particular, the base layer may have a ratio ($Rth_{max}/Ro_{min}$) of the maximum thickness direction retardation ($Rth_{max}$) to the minimum in-plane retardation ($Ro_{min}$) of 30 or more, 40 or more, 50 or more, or 60 or more.

Retardations of the Optical Multilayer Film

Meanwhile, the optical multilayer film in which the base layer, the primer layer, the hard coat layer, the first refractive layer, and the second refractive layer are laminated may have the same retardations as those of the base layer.

Specifically, the in-plane retardation (Ro), the thickness direction retardation (Rth), the minimum in-plane retardation ($Ro_{min}$), and the maximum thickness direction retardation ($Rth_{max}$), the ratio between them, the change ($|\Delta Ro|/|\Delta x|$) in the in-plane retardation with respect to a displacement in the transverse direction, and the change ($|\Delta Rth|/|\Delta x|$) in the thickness direction retardation with respect to a displacement in the transverse direction of the optical multilayer film may be the same as those of the base layer, respectively.

In particular, the retardations of the optical multilayer film can be further enhanced by designing the correlation between the refractive indices and the thicknesses of the base layer, the primer layer, the hard coat layer, the first refractive layer, and the second refractive layer as described above. According to the above, the optical multilayer film can be applied to a display device to implement excellent optical properties.

Retardations and Thicknesses of the Respective Layers

According to the above embodiment, when the refractive indices of the base layer, the primer layer, the hard coat layer, the first refractive layer, and the second refractive layer are n1, n2, n3, n4, and n5, they satisfy the above Equations (1) to (4).

In such event, the refractive index (n1) of the base layer may be in a range of 1.61 to 1.69. Alternatively, the refractive index (n1) of the base layer may be in a range of 1.63 to 1.68 or in a range of 1.63 to 1.67.

The refractive index (n2) of the primer layer may be in a range of 1.50 to 1.70. Alternatively, the refractive index (n2) of the primer layer may be in a range of 1.53 to 1.63, in a range of 1.53 to 1.58, in a range of 1.54 to 1.62, in a range of 1.55 to 1.61, or in a range of 1.58 to 1.63.

In addition, the refractive index (n3) of the hard coat layer may be in a range of 1.40 to 1.70. Alternatively, the refractive index (n3) of the hard coat layer may be in a range of 1.45 to 1.60 or in a range of 1.50 to 1.53.

In addition, the refractive index (n4) of the first refractive layer may be in a range of 1.70 to 1.80 or in a range of 1.70 to 1.75.

In addition, the refractive index (n5) of the second refractive layer may be in a range of 1.10 to 1.40 or in a range of 1.25 to 1.35.

As a specific example, the base layer may have a refractive index (n1) of 1.63 to 1.68, and the primer layer may have a refractive index (n2) of 1.54 to 1.62.

As another specific example, the base layer may have a refractive index (n1) of 1.63 to 1.68, and the primer layer may have a refractive index (n2) of 1.55 to 1.61.

As still another specific example, the base layer may have a refractive index (n1) of 1.63 to 1.68, the primer layer may have a refractive index (n2) of 1.54 to 1.62, and the first refractive layer may have a refractive index (n4) of 1.70 to 1.75.

As still another specific example, the base layer may have a refractive index (n1) of 1.63 to 1.68, the primer layer may have a refractive index (n2) of 1.54 to 1.62, and the second refractive layer may have a refractive index (n5) of 1.25 to 1.35.

As still another specific example, the base layer may have a refractive index (n1) of 1.63 to 1.68, the primer layer may have a refractive index (n2) of 1.55 to 1.61, the hard coat layer may have a refractive index (n3) of 1.50 to 1.53, the first refractive layer may have a refractive index (n4) of 1.70 to 1.75, and the second refractive layer may have a refractive index (n5) of 1.25 to 1.35.

In addition, the difference (n1−n3) in the refractive indices between the base layer and the hard coat layer may be in a range of 0.05 to 0.20, in a range of 0.09 to 0.16, in a range of 0.05 to 0.15, or in a range of 0.10 to 0.20.

In addition, the difference (n4−n5) in the refractive indices between the first refractive layer and the second refractive layer may be in a range of 0.03 to 0.60, in a range of 0.40 to 0.50, in a range of 0.30 to 0.50, or in a range of 0.40 to 0.60.

The base layer may have a thickness of 10 μm to 100 μm. Alternatively, the thickness of the base layer may be 20 μm to 60 μm or 40 μm to 60 μm.

The primer layer may have a thickness of 50 nm to 120 nm. Alternatively, the thickness of the primer layer may be 80 nm to 95 nm, 80 nm to 90 nm, or 80 nm to 85 nm.

The hard coat layer may have a thickness of 0.5 μm to 100 μm. Alternatively, the thickness of the hard coat layer may be 1 μm to 10 μm, 1 μm to 8 μm, 1 μm to 5 μm, or 1.5 μm to 3.5 μm.

The first refractive layer may have a thickness of 5 nm to 150 nm. Alternatively, the thickness of the first refractive layer may be 10 nm to 130 nm or 20 nm to 100 nm.

The second refractive layer may have a thickness of 10 nm to 1 μm. Alternatively, the thickness of the second refractive layer may be 80 nm to 120 nm, 80 nm to 100 nm, 90 nm to 110 nm, or 100 nm to 120 nm.

According to a specific example, the hard coat layer may have a thickness of 1 μm to 5 μm, the first refractive layer may have a thickness of 5 nm to 150 nm, and the second refractive layer may have a thickness of 80 nm to 120 nm.

According to another specific example, the primer layer may have a thickness of 80 nm to 95 nm, and the second refractive layer may have a thickness of 80 nm to 120 nm.

According to still another specific example, the primer layer may have a thickness of 80 nm to 95 nm, and the base layer may have a thickness of 20 μm to 60 μm.

According to a more specific example, the base layer may have a refractive index (n1) of 1.63 to 1.68 and a thickness of 20 μm to 60 μm, the primer layer may have a refractive index (n2) of 1.54 to 1.62 and a thickness of 80 nm to 95 nm, the hard coat layer may have a refractive index (n3) of 1.50 to 1.53 and a thickness of 1 μm to 5 μm, the first refractive layer may have a refractive index (n4) of 1.70 to 1.75 and a thickness of 5 nm to 150 nm, and the second refractive layer may have a refractive index (n5) of 1.25 to 1.35 and a thickness of 80 nm to 120 nm.

Within the above ranges, the reflection may be low and other optical characteristics can be enhanced when it is applied to an optical component for a display device or the like.

Hereinafter, each layer will be described in more detail.
Base Layer

The base layer comprises a polyester resin.

The polyester resin may be a homopolymer resin or a copolymer resin in which a dicarboxylic acid and a diol are polycondensed. In addition, the polyester resin may be a blend resin in which the homopolymer resins or the copolymers resin are mixed.

Examples of the dicarboxylic acid include terephthalic acid, isophthalic acid, orthophthalic acid, 2,5-naphthalene dicarboxylic acid, 2,6-naphthalene dicarboxylic acid, 1,4-naphthalene dicarboxylic acid, 1,5-naphthalene dicarboxylic acid, diphenylcarboxylic acid, diphenoxyethane dicarboxylic acid, diphenylsulfone dicarboxylic acid, anthracenedicarboxylic acid, 1,3-cyclopentanedicarboxylic acid, 1,3-cyclohexanedicarboxylic acid, 1,4-cyclohexanedicarboxylic acid, hexahydroterephthalic acid, hexahydroisophthalic acid, malonic acid, dimethyl malonic acid, succinic acid, 3,3-diethyl succinic acid, glutaric acid, 2,2-dimethylglutaric acid, adipic acid, 2-methyladipic acid, trimethyladipic acid, pimelic acid, azelaic acid, sebacic acid, suberic acid, dodecadicarboxylic acid, and the like.

In addition, examples of the diol include ethylene glycol, propylene glycol, hexamethylene glycol, neopentyl glycol, 1,2-cyclohexanedimethanol, 1,4-cyclohexanedimethanol, decamethylene glycol, 1,3-propanediol, 1,4-butanediol, 1,5-pentanediol, 1,6-hexanediol, 2,2-bis(4-hydroxyphenyl)propane, bis(4-hydroxyphenyl)sulfone, and the like.

Preferably, the polyester resin may be an aromatic polyester resin having excellent crystallinity. For example, it may have a polyethylene terephthalate (PET) resin as a main component.

As an example, the base layer may comprise a PET resin in an amount of at least about 85% by weight, more specifically at least 90% by weight, at least 95% by weight, or at least 99% by weight. As another example, the base layer may further comprise a polyester resin other than the PET resin. Specifically, the base layer may further comprise up to about 15% by weight of a polyethylene naphthalate (PEN) resin. More specifically, the base layer may further comprise a PEN resin in an amount of about 0.1% by weight to 10% by weight or about 0.1% by weight to 5% by weight.

The base layer is preferably a stretched film due to its high crystallinity and excellent mechanical properties. Specifically, the base layer may be a biaxially stretched polyester film. For example, it may be a film stretched at a stretch ratio of 2.0 to 5.0 in the longitudinal direction (MD) and in the transverse direction (TD), respectively.

In addition, the base layer can have increased crystallinity and enhanced mechanical properties in terms of tensile strength and the like in the process of preparing the same through heating, stretching, and the like as it comprises polyester as a main component.

For example, the base layer may have a crystallinity of 35% to 55%. Within the above range, excessive crystallization can be prevented while excellent mechanical properties in terms of tensile strength and the like are secured. In addition, the base layer preferably has a pencil hardness of 5B or higher. Within the above range, it is possible to protect the polarizer from the outside.

In addition, the base layer preferably has a tensile modulus of 3.0 GPa or more or 3.5 GPa or more at a high temperature (e.g., 85° C.). Within the above range, it is advantageous to preventing curling of an optical component at the time of thermal treatment at a high temperature once the optical multilayer film, which comprises the base layer, has been adopted in the optical component. In more detail, polyvinyl alcohol (PVA) used as a polarizer has a high shrinkage and thus easily curls during the thermal treatment step. Thus, if it is not suppressed, the base layer may be wrinkled, generating a wave pattern, and the visibility may be significantly deteriorated by the glitter phenomenon.

Accordingly, it is advantages to preventing curling of a polarizer that the base layer has a high tensile modulus at a high temperature, which may prevent a wave pattern, glitter phenomenon, peeling off between the base layer and the polarizer, cracking, and the like.

Primer Layer

A primer layer is formed on the base layer.

The primer layer serves to enhance the adhesion between the base layer and the hard coat layer.

The primer layer may comprise a thermosetting resin.

For example, the primer layer may comprise a polyurethane-based resin, a polyester-based resin, or a mixture thereof, but it is not limited thereto.

Specifically, the primer layer may comprise at least 50% by weight of any one of a polyurethane-based resin and a polyester-based resin.

Hard Coat Layer

A hard coat layer is formed on the primer layer. The hard coat layer serves to enhance the hardness of the surface of the optical multilayer film. The hard coat layer may comprise a photocurable resin.

Examples of the photocurable resin include compounds having one or two or more unsaturated bonds such as compounds having an acrylate-based functional group. Examples of the compound having one unsaturated bond include ethyl (meth)acrylate, ethylhexyl (meth)acrylate, styrene, methylstyrene, N-vinylpyrrolidone, and the like. Examples of the compound having tow unsaturated bonds include polymethylolpropane tri(meth)acrylate, tripropylene glycol di(meth)acrylate, diethylene glycol di(meth)acrylate, pentaerythritol tri(meth)acrylate, pentaerythritol tetra(meth)acrylate, dipentaerythritol hexa(meth)acrylate, dipentaerythritol penta(meth)acrylate, 1,6-hexanediol di(meth)acrylate, neopentyl glycol di(meth)acrylate, compounds obtained by modifying the above polyfunctional compounds with ethylene oxide (EO), reaction products of the above polyfunctional compounds and a (meth)acrylate (such as poly(meth)acrylate esters of polyhydric alcohols), and the like. As used herein, "(meth)acrylate" refers to methacrylate and acrylate.

In addition, as the photocurable resin, a polyester resin, a polyether resin, an acrylic resin, an epoxy resin, a urethane resin, an alkyd resin, a spiroacetal resin, a polybutadiene resin, a polythiol polyene resin, or the like, which has an unsaturated double bond and having a relatively low molecular weight (for example, a number average molecular weight of 300 g/mole to 80,000 g/mole, preferably 400 g/mole to 5,000 g/mole), may be used.

Preferably, a compound having three or more unsaturated bonds may be used as the photocurable resin. The use of these compounds can enhance the crosslinking density and hardness of the hard coat layer thus formed. Specifically, pentaerythritol triacrylate, pentaerythritol tetraacrylate, a polyester polyfunctional acrylate oligomer (3 to 15 functionalities), a urethane polyfunctional acrylate oligomer (3 to 15 functionalities), and the like are preferably used in a proper combination as the photocurable resin.

The photocurable resin may be used in combination with a solvent-drying-type resin. The use of the solvent-drying-type resin in combination makes it possible to effectively prevent coating defects on the coated surface. The solvent-drying-type resin refers to a resin that becomes a coating layer by only drying the solvent added to adjust the solids content at the time of application.

A thermoplastic resin is generally used as the solvent-drying-type resin. Examples of the thermoplastic resin include a styrene-based resin, a (meth)acrylic-based resin, a vinyl acetate-based resin, a vinyl ether-based resin, a halogen-containing resin, an alicyclic olefin-based resin, a polycarbonate-based resin, a polyester-based resin, a polyamide-based resin, a cellulose derivative, a silicone-based resin, a rubber, an elastomer, and the like. The thermoplastic resin is preferably amorphous and soluble in an organic solvent. In particular, a styrene-based resin, a (meth)acrylic-based resin, an alicyclic olefin-based resin, a polyester-based resin, a cellulose derivative, and the like are preferable from the viewpoint of the film forming property, transparency, and weatherability.

In addition, the composition for the hard coat layer may comprise a thermosetting resin. Examples of the thermosetting resin include a phenol resin, a urea resin, a diallyl phthalate resin, a melamine resin, a guanamine resin, a unsaturated polyester resin, a polyurethane resin, an epoxy resin, an aminoalkyd resin, a melamine-urea co-condensation resin, a polysiloxane resin, and the like.

First Refractive Layer (or High Refractive Index Layer)

A first refractive layer is formed on the hard coat layer.

The first refractive layer may comprise a resin that contains, for example, metal oxide fine particles having a refractive index of 1.70 to 2.80.

The metal oxide fine particles may be one selected from, for example, titanium oxide ($TiO_2$), zirconium oxide ($ZrO_2$), cerium oxide ($CeO_2$), tin oxide ($SnO_2$), antimony oxide ($Sb_2O_5$), zinc antimonate ($ZnSb_2O_6$), antimony-tin oxide (ATO), indium-tin oxide (ITO), phosphorous-tin oxide (PTO), aluminum-zinc oxide (AZO), gallium-zinc oxide (GZO), and combinations thereof.

Second Refractive Layer (or Low Refractive Index Layer)

A second refractive layer is formed on the hard coat layer.

The second refractive layer may comprise any one from, for example, (i) a resin that contains inorganic fine particles of a low refractive index such as silica or magnesium fluoride, (ii) a fluorine-based resin as a low refractive index resin, (iii) a fluorine-based resin that contains inorganic fine particle of a low refractive index such as silica or magnesium fluoride, and (iv) inorganic material of a low refractive index such as silica or magnesium fluoride. The silica is preferably hollow silica fine particles.

The fluorine-based resin may be a polymerizable compound that contains a fluorine atom at least in its molecule or a polymer therefrom. In such event, the polymerizable compound is not particularly limited, but it preferably has a curable reactive group such as a photocurable functional group, a thermosetting polar group, and the like.

A fluorine-containing monomer having an ethylenically unsaturated bond can be used as the polymerizable compound having a photocurable functional group. More specifically, fluoroolefins (e.g., fluoroethylene, vinylidene fluoride, tetrafluoroethylene, hexafluoropropylene, perfluorobutadiene, perfluoro-2,2-dimethyl-1,3-dioxol, and the like) may be exemplified. As those having a (meth)acryloyloxy group, a (meth)acrylate compound having a fluorine atom in the molecule such as 2,2,2-trifluoroethyl (meth)acrylate, 2,2,3,3,3-pentafluoropropyl (meth)acrylate, 2-(perfluorobutyl)ethyl (meth)acrylate, 2-(perfluorohexyl)ethyl (meth)acrylate, 2-(perfluorooctyl)ethyl (meth)acrylate, 2-(perfluorodecyl)ethyl (meth)acrylate, methyl α-trifluoromethacrylate, ethyl α-trifluoromethacrylate; a fluorine-containing polyfunctional (meth)acrylate compound having a fluoroalkyl group having 1 to 14 carbon atoms and at least 3 fluorine atoms, a fluorocycloalkyl group or a fluoroalkylene group, and at least two (meth)acryloyloxy groups, and the like may be used.

Examples of the thermosetting polar group include hydrogen bond forming groups such as a hydroxyl group, a carboxyl group, an amino group, an epoxy group, and the like. They are excellent not only in adhesion to a coating layer, but also in affinity with inorganic ultrafine particles such as silica. Examples of the polymerizable compound having a thermosetting polar group include a 4-fluoroethylene-perfluoroalkyl vinyl ether copolymer; a fluoroethylene-hydrocarbon-based vinyl ether copolymer; fluorine-modified products of various resins such as epoxy, polyurethane, cellulose, phenol, polyimide, and the like.

Examples of the polymerizable compound having a photocurable functional group and a thermosetting polar group include alkyl, alkenyl, and aryl esters of partially or fully fluorinated acrylic or methacrylic acid, fully or partially fluorinated vinyl ethers, fully or partially fluorinated vinyl esters, fully or partially fluorinated vinyl ketones, and the like.

As a specific example, the base layer may comprise a polyethylene terephthalate-based resin, the primer layer may comprise a thermosetting polyurethane-based resin, the hard coat layer may comprise a photocurable acrylate-based resin, the first refractive layer may comprise titanium oxide ($TiO_2$) or zirconium oxide ($ZrO_2$), and the second refractive layer may comprise silica fine particles.

Process for Preparing an Optical Multilayer Film

The process for preparing an optical multilayer film comprises (1) extruding a polyester resin to obtain an unstretched sheet; (2) preheating the unstretched sheet at a temperature of 70° C. to 90° C. and then stretching the sheet at a longitudinal stretch ratio (R1) of 2.0 to 5.0 and a transverse stretch ratio (R2) of 2.0 to 5.0; (3) heat setting the stretched sheet at 150° C. to 250° C. to prepare a base layer; and (4) sequentially laminating a primer layer, a hard coat layer, a first refractive layer, and a second refractive layer on the base layer.

Preparation of a Base Layer

In the above preparation process, the base layer is prepared by extruding a raw resin and subjecting it to preheating, stretching, and heat setting. In such event, the composition of the polyester resin used as a raw material of the base layer is as described above.

In addition, the extrusion may be carried out at a temperature of 230° C. to 300° C. or 250° C. to 280° C.

The base layer is preheated at a certain temperature before stretching thereof. The preheating temperature satisfies the range of Tg+5° C. to Tg+50° C. based on the glass transition temperature (Tg) of the polyester resin, and it is determined to satisfy the range of 70° C. to 90° C. at the same time. Within the above range, the base layer may be soft enough to be readily stretched, and it is possible to effectively prevent the phenomenon of breakage during stretching thereof as well.

The stretching is carried out by biaxial stretching. For example, it may be carried out in the transverse direction (or tenter direction, TD) and in the longitudinal direction (or machine direction, MD) through a simultaneous biaxial stretching method or a sequential biaxial stretching method. Preferably, it may be carried out by a sequential biaxial stretching method in which stretching is first performed in one direction and then stretching is performed in the direction perpendicular thereto.

The longitudinal stretch ratio (R1) may be in a range of 2.0 to 5.0, more specifically 2.8 to 3.5. In addition, the transverse stretch ratio (R2) may be in a range of 2.0 to 5.0, more specifically 2.9 to 3.7. Preferably, the longitudinal stretch ratio (R1) and the transverse stretch ratio (R2) are similar to each other. Specifically, the ratio (R1/R2) of the longitudinal stretch ratio to the transverse stretch ratio may be 0.9 to 1.1 or 0.9 to 1.0.

The stretch ratios (R1 and R2) refer to the ratios that represent the length after stretching with respect the length before stretching being 1.0.

In addition, the stretch speed may be 6.5 m/min to 8.5 m/min, but it is not particularly limited thereto.

The stretched sheet is heat set at 150° C. to 250° C., more specifically 160° C. to 230° C. The heat setting may be carried out for 5 seconds to 1 minute, more specifically for 10 seconds to 45 minutes.

After the heat setting is initiated, the sheet may be relaxed in the longitudinal direction and/or in the transverse direction, and the temperature range therefor may be 150° C. to 250° C.

Formation of a Primer Layer

A primer layer is formed on the base layer.

The primer layer may be formed from a coating composition that comprises a thermosetting resin. For example, the coating composition may comprise a polyester-based resin, a polyurethane-based resin, or a mixture thereof. Specifically, the coating composition may comprise any one of a polyester-based resin and a polyurethane-based resin in an amount of at least 50% by weight. In addition, the coating composition may be an aqueous solution or an aqueous dispersion that comprise these resins.

The primer layer may be formed from a composition obtained by mixing and dispersing a raw material resin and, as required, a photoinitiator and other additives in a solvent.

A known apparatus such as a paint shaker, a bead mill, or a kneader may be used for the mixing and dispersion.

Water may be preferably used as the solvent. Thus, the composition for the primer layer may be prepared in the form of an aqueous coating liquid such as an aqueous solution, an aqueous dispersion, or an emulsion. In addition, an organic solvent may be used in a small amount.

Examples of the organic solvent include alcohols (such as methanol, ethanol, propanol, isopropanol, n-butanol, s-butanol, t-butanol, benzyl alcohol, propylene glycol methyl ether, and ethylene glycol), ketones (such as acetone, methyl ethyl ketone, methyl isobutyl ketone, cyclopentanone, cyclohexanone, heptanone, diisobutyl ketone, and diethyl ketone), aliphatic hydrocarbons (such as hexane and cyclohexane), halogenated hydrocarbons (such as methylene chloride, chloroform, and carbon tetrachloride), aromatic hydrocarbons (such as benzene, toluene, and xylene), amides (such as dimethylformamide, dimethylacetamide, and n-methylpyrrolidone), ethers (such as diethyl ether, dioxane, and tetrahydrofuran), ether alcohols (such as 1-methoxy-2-propanol), esters (such as methyl acetate, ethyl acetate, butyl acetate, and isopropyl acetate), and the like.

The additives are not particularly limited. Examples thereof include a leveling agent, an organic or inorganic fine particle, a photoinitiator, a thermal polymerization initiator, a crosslinking agent, a curing agent, a polymerization accelerator, a viscosity adjusting agent, an antistatic agent, an antioxidant, an antifouling agent, a slipping agent, a refractive index adjusting agent, dispersant, and the like.

The composition for the primer layer preferably has a solids content of 3% by weight to 20% by weight or 4% by weight to 10% by weight. Within the above range, it is possible to reduce the problem of residual solvent or whitening and to prevent an increase in the viscosity, thereby securing excellent coating workability and readily controlling the thickness, which prevents the formation of stains or streaks on the surface.

The timing for application of the composition for the primer layer to the base layer is not particularly limited. Preferably, it may be applied during the preparation of the base layer; more specifically, it may be applied before the crystallization by orientation of the polyester resin in the base layer is completed.

Once the composition for the primer layer has been applied, it is preferable that stretching and heat setting are carried out.

When the composition for the primer layer is applied to the base layer, the surface of the base layer is subjected to physical treatment such as corona surface treatment, flame treatment, plasma treatment, or the like as a preliminary treatment for enhancing the coatability, or a chemically inert surfactant may be used in combination with the composition for the primer layer.

As the coating method of the composition for the primer layer, any known coating method may be used. For example, a roll coating method, a gravure coating method, a roll brush method, a spray coating method, an air knife coating method, an impregnation method, and a curtain coating method may be used alone or in combination thereof. The primer layer may be formed on only one side of the polyester base layer or on both sides thereof, as required.

The primer layer may be subjected to a surface treatment such as saponification treatment, plasma treatment, corona treatment, ultraviolet ray treatment, or the like within a range that does not adversely affect the physical properties of the optical multilayer film.

Formation of a Hard Coat Layer

Next, a hard coat layer is formed on the primer layer.

The hard coat layer may be formed from a composition obtained by mixing and dispersing a raw material resin and, as required, a photoinitiator and other additives in a solvent.

The raw material resin used in the formation of the hard coat layer is a photocurable resin, a thermosetting resin, or the like. Specific examples thereof are as exemplified above.

The photoinitiator is not particularly limited, and known photoinitiators may be used. Examples thereof include acetophenones, benzophenones, methyl benzoyl benzoates, α-amyl oxime esters, thioxanthones, propiophenones, benzyls, benzoins, and acylphosphine oxides. Specifically, in the case where the photocurable resin has a radical polymerizable unsaturated group, acetophenones, benzophenones, thioxanthones, benzoin, benzoin methyl ethers, or the like may be used as the photoinitiator. In addition, in the case where the photocurable resin has a cationic polymerizable functional group, an aromatic diazonium salt, an aromatic sulfonium salt, an aromatic iodonium salt, a metallocene compound, a benzoin sulfonic acid ester, or the like may be used as the photoinitiator. The content of the photoinitiator in the composition for the hard coat layer is preferably 1 to 10 parts by weight or 2 to 8 parts by weight based on 100 parts by weight of the photocurable resin. Within the above range, it is advantageous in that the optical multilayer film has an excellent surface hardness and effective internal curing upon irradiation of light is secured.

The composition for the hard coat layer may contain a solvent. The solvent may be chosen depending on the type and solubility of the raw material resin component. Examples thereof include ketones (such as acetone, methyl ethyl ketone, methyl isobutyl ketone, cyclohexanone, and diacetone alcohol), ethers (such as dioxane, tetrahydrofuran, propylene glycol monomethyl ether, and propylene glycol monomethyl ether acetate), aliphatic hydrocarbons (such as hexane), alicyclic hydrocarbons (such as cyclohexane), aromatic hydrocarbons (such as toluene and xylene), halogenated hydrocarbons (such as dichloromethane and dichloroethane), esters (such as methyl acetate, ethyl acetate, and butyl acetate), water, alcohols (such as ethanol, isopropanol, butanol, and cyclohexanol), cellosolves (methylcellosolve and ethylcellosolve), cellosolve acetate, sulfoxides (such as dimethyl sulfoxide), amides (such as dimethylformamide and dimethylacetamide), and combinations thereof. Ketone-based solvents such as methyl ethyl ketone, methyl isobutyl ketone, and cyclohexanone among the above are preferable in terms of the compatibility with the resin and the enhancement in coating workability.

The solids content of the hard coat layer composition is not particularly limited, but it is preferably 5% by weight to 70% by weight or 25% by weight to 60% by weight.

In addition, the composition for the hard coat layer may have a viscosity of about 5 mPa·s to 30 mPa·s at 25° C. Within the above viscosity range, defects can be minimized during coating on the primer layer, and the coating can be easily carried out in a uniform thickness.

The composition for the hard coat layer may further contain known organic or inorganic fine particles, a dispersant, a surfactant, an antistatic agent, a silane coupling agent, a thickener, a coloring inhibitor, a colorant (pigment, dye), a defoaming agent, a leveling agent, a flame retardant, an ultraviolet adsorbent, an adhesion-imparting agent, a polymerization inhibitor, an antioxidant, a surface modifier, or the like, depending on the desired functions. As the antistatic agent among the above, a cationic antistatic agent such as quaternary ammonium salts or the like, fine particles such as indium tin oxide (ITO), conductive polymers, or the like may be used. The antistatic agent may be used in an amount of 1 to 30% by weight based on the weight of the solids content of the composition for the hard coat layer.

A known apparatus such as a paint shaker, a bead mill, a kneader, or a mixer may be used for the mixing of the respective components of the composition for the hard coat layer.

In addition, a gravure coating method, a spin coating method, an impregnation method, a spray method, a die coating method, a bar coating method, a roll coater method, a meniscus coater method, a flexo printing method, a screen printing method, a feed coater method, or the like may be used for the coating of the composition for the hard coat layer.

Once the composition for the hard coat layer has been coated, it may be subjected to heating and/or drying, as required, followed by irradiation with active energy rays or the like for the curing thereof.

Examples of the irradiation with active energy rays include irradiation with ultraviolet rays or electron beams. The ultraviolet irradiation may be carried out by an ultra-high-pressure mercury lamp, a high-pressure mercury lamp, a low-pressure mercury lamp, a carbon arc lamp, a black light fluorescent lamp, a metal halide lamp, or the like. The wavelength of ultraviolet rays may be in a range of 190 nm to 380 nm; and the amount of ultraviolet radiation may be 80 mJ/cm$^2$ or more, 100 mJ/cm$^2$ or more, or 130 mJ/cm$^2$ or more. In addition, the electron beam irradiation may be carried out with various electron beam accelerators such as a Cockcroft-Walton type, a Van der Graaff type, a resonant transformer type, an insulating core transformer type, a linear type, a dynamitron type, a high frequency type, or the like.

Formation of a First Refractive Layer and a Second Refractive Layer

Next, a first refractive layer and a second refractive layer are formed on the hard coat layer.

The first refractive layer and the second refractive layer may be formed from a composition obtained by mixing and dispersing a raw material resin and, as required, a curing agent and other additives in a solvent.

Specific examples of the raw material resin used in the formation of the first refractive layer and the second refractive layer are as exemplified above.

The composition for the first refractive layer and the composition for the second refractive layer may suitably contain a curing agent for curing the reactive groups or the like, various additives for enhancing coating workability or imparting antifouling properties, and a solvent.

In addition, the viscosity of the composition for the first refractive layer and the composition for the second refractive layer is preferably adjusted to a range of 0.5 mPa·s to 5 mPa·s (25° C.) or 0.7 mPa·s to 3 mPa·s (25° C.). Within the above range, it is more advantageous to forming an excellent antireflection layer of visible light, to being uniform and having no coating stains, and to enhancing adhesion.

Curing of the raw material resin may be carried out in a manner similar to that in the hard coating layer. In addition, when a heating means is used for the curing treatment, it is preferable that a thermal polymerization initiator, which generates radicals by heating to initiate polymerization of the polymerizable compound, is added to the raw material resin.

Optical Component

The optical multilayer film according to the embodiment may be employed in an optical component.

The optical component, which comprises the optical multilayer film according to the embodiment, may have a low reflectance and enhanced optical characteristics.

For example, the optical component may have a reflectance of 1.5% or less with respect to light having a wavelength of 550 nm. Specifically, the optical component may have a reflectance of 1% or less, 0.5% or less, or 0.2% or less with respect to light having a wavelength of 550 nm; more specifically in a range of 0.1% to 1.5%, in a range of 0.1% % to 1.0%, in a range of 0.1% to 0.5%, or in a range of 0.1% to 0.2%. Thus, the optical component is hardly reflected by external light, whereby the visibility can be enhanced.

The optical component may specifically be a polarizing plate.

FIG. 5 is a cross-sectional view of a polarizing plate according to one embodiment.

Referring to FIG. 5, the polarizing plate (10) according to one embodiment comprises a polarizer (11) and an optical multilayer film (12) disposed on at least one side of the polarizer.

The polarizer acts to polarize incident natural light vibrating in various directions to light vibrating in one direction. The polarizer may be a polyvinyl alcohol (PVA) layer stained with iodine or the like. In such event, the PVA molecules contained in the PVA layer may be aligned in one direction.

Display Device

The optical component according to the embodiment may be employed in a display device.

The display device comprises a display panel and an optical component disposed on at least one of the upper and lower sides of the display panel.

In such event, an optical component having the configuration as described above is used as the optical component.

The display device may be provided as a liquid crystal display device, an organic electroluminescent display device, or the like depending on the type of display panel.

Liquid Crystal Display Device

FIG. 6 is a schematic cross-sectional view of a liquid crystal display (LCD) device according to one embodiment. Referring to FIG. 6, the liquid crystal display according to one embodiment comprises a liquid crystal panel (70) and a backlight unit (80).

The backlight unit emits light to the liquid crystal panel. The liquid crystal panel displays an image using light from the backlight unit.

Meanwhile, various kinds of light sources may be employed in the backlight unit according to the emission wavelength.

FIG. 8 illustrates the spectra of various light sources applied to a backlight unit of an LCD device. Referring to FIG. 8, in the case of a liquid crystal display device in which a conventional optical film is employed, it is applicable only to a light source in which some colors are mixed like the light source 1.

In recent years, however, in order to implement vivid colors, light sources that emit light of respective colors with a minimized region in which red (R), green (G), and blue (B) overlap with each other are used. Conventional optical films have limitations in realizing desired optical properties when they are applied to such light sources.

In contrast, the optical multilayer film according to the embodiment, in which the respective layers are designed as described above, can implement vivid colors without such defects as rainbow strains even when it is applied to light sources such as the light source 2 or 3 with a minimized region in which red (R), green (G), and blue (R) overlap with each other, as well as light sources such as the light source 1 in which some colors are mixed.

For example, the liquid crystal display device, which is provided with the optical multilayer film according to the embodiment, can adopt a light source that indicates two or more peaks having a full width at half maximum (FWHM) of 50 nm or less, for example, 45 nm or less, for example, 40 nm or less in the range of 400 nm to 800 nm to the backlight unit.

The liquid crystal panel (70) comprises an upper polarizing plate (10), a color filter substrate (71), a liquid crystal layer (72), a thin film transistor (TFT) substrate (73), and a lower polarizing plate (10').

The TFT substrate and the color filter substrate are opposite to each other. The TFT substrate may comprise a plurality of pixel electrodes corresponding to each pixel, thin film transistors connected to the pixel electrodes, a plurality of gate lines for applying driving signals to the thin film transistors, and a plurality of data lines for applying a data signal to the pixel electrodes.

The color filter substrate comprises a plurality of color filters corresponding to respective pixels. The color filters may filter transmitted light to implement respective red, green, and blue colors. In addition, the color filter substrate may comprise a common electrode opposite to the pixel electrodes.

The liquid crystal layer is interposed between the TFT substrate and the color filter substrate. The liquid crystal layer may be driven by the TFT substrate. More specifically, the liquid crystal layer may be driven by an electric field applied between the pixel electrodes and the common electrode. The liquid crystal layer can adjust the polarization direction of light that has passed through the lower polarizing plate. That is, the TFT substrate can adjust the potential difference applied between the pixel electrodes and the common electrode in pixel units. Thus, the liquid crystal layer can be driven to have different optical characteristics in pixel units.

At least one of the upper polarizing plate and the lower polarizing plate may have substantially the same configuration as that of the polarizing plate according to the embodiment as described above.

The lower polarizing plate is disposed below the TFT substrate. The lower polarizing plate may be attached to the lower side of the TFT substrate.

The upper polarizing plate is disposed on the color filter substrate. The upper polarizing plate may be attached to the upper side of the color filter substrate.

The polarization directions of the upper polarizing plate and the lower polarizing plate may be the same as, or perpendicular to, each other.

As described above, the upper polarizing plate and/or the lower polarizing plate comprises an optical multilayer film having enhanced performance. Thus, the liquid crystal display device according to one embodiment can have enhanced brightness, image quality, and durability.

Organic Electroluminescent Display Device

FIG. 7 is a schematic cross-sectional view of an organic electroluminescent display device according to one embodiment.

Referring to FIG. 7, the organic electroluminescent display device according to one embodiment comprises a front polarizing plate (10) and an organic electroluminescent panel (90).

The front polarizing plate may be disposed on the front side of the organic electroluminescent panel. More specifically, the front polarizing plate may be attached to the side on which an image is displayed in the organic electroluminescent panel. The front polarizing plate may have substantially the same configuration as that of the polarizing plate according to the embodiment as described above.

The organic electroluminescent panel (90) displays an image by self-emission of a pixel unit. The organic electroluminescent panel (90) comprises an organic electroluminescent substrate (91) and a driving substrate (92).

The organic electroluminescent substrate comprises a plurality of organic electroluminescent units each corresponding to a pixel. Each of the organic electroluminescent units comprises a cathode, an electron transport layer, a light emitting layer, a hole transport layer, and an anode.

The driving substrate is drivably coupled to the organic electroluminescent substrate. That is, the driving substrate may be coupled to the organic electroluminescent substrate so as to apply a driving signal such as a driving current. More specifically, the driving substrate may drive the organic electroluminescent substrate by applying a current to each of the organic electroluminescent units.

Since the front polarizing plate has a low reflectance and enhanced optical characteristics, the organic electroluminescent display according to one embodiment can have a low reflectance, enhanced brightness, and enhanced image quality.

MODE FOR THE INVENTION

Hereinafter, the present invention will be described more specifically with reference to examples. But the scope of the present invention is not limited thereto only.

Example 1: Preparation of an Optical Multilayer Film

Step (1) Preparation of a Base Layer

A polyethylene terephthalate (PET) resin (SKC) was extruded at about 280° C. by an extruder and cast at about 30° C. on to a casting roll to prepare an unstretched sheet. The unstretched sheet was preheated at the temperature shown in Table 1, followed by stretching thereof in the machine direction (MD) and the tenter direction (TD) at a temperature of 125° C. at the stretch ratios shown in Table 1. Thereafter, the stretched sheet was heat set at the temperature shown in Table 1 for about 30 seconds to prepare a base layer.

Step (2) Formation of a Primer Layer

In the above step of preparing the base layer, a primer layer was formed on the base layer after stretching thereof in the machine direction (MD) and before stretching thereof in the tenter direction (TD). At that time, a thermosetting polyurethane resin composition was coated on the base layer using a Meyer bar and dried to form a primer layer.

Step (3) Formation of a Hard Coat Layer

Pentaerythritol triacrylate (PETA) was dissolved in a methyl isobutyl ketone (MIBK) solvent at a concentration of 30 by weight, followed by the addition thereto of a photoinitiator (Irg184, BASF) at a concentration of 5% by weight based on the solids content, thereby preparing a composition for a hard coat layer. The composition for a hard coat layer was coated on the primer layer by a bar coater to form a coating layer such that the layer thickness after drying was of 5 μm. The coating film thus formed was dried at 80° C. for 1 minute to remove the solvent and set by ultraviolet irradiation at about 300 mJ/cm$^2$ to form a hard coat layer having the refractive index shown in Table 2 below.

Step (4) Formation of a First Refractive Layer

A first refractive layer was formed on the hard coat layer from a composition that contained a polyfunctional acrylate resin and titanium oxide (TiO$_2$). Once the composition had been coated on the hard coat layer, it was dried at 80° C. for 1 minute and irradiated with ultraviolet rays at about 650 mJ/cm$^2$ under the nitrogen purging condition to form a first refractive layer. At that time, the composition contained about 40% by weight of solids and had a viscosity of about 6.5 mPa·s at 25° C.

Step (5) Formation of a Second Refractive Layer

A second refractive layer was formed on the first refractive layer from a resin that contained silica fine particles.

The refractive index and thickness of each layer of the optical multilayer film of Example 1 are summarized in the following table.

TABLE 1

| No | Layer | Refractive index | Thickness |
|---|---|---|---|
| 1 | Base layer | 1.66 | 40 μm |
| 2 | Primer layer | 1.60 | 85 nm |
| 3 | Hard coat layer | 1.52 | 2.5 μm |
| 4 | First refractive layer | 1.75 | 60 nm |
| 5 | Second refractive layer | 1.29 | 100 nm |

Test Example 1: Measurement of Reflectance

The reflectance of the optical multilayer film prepared in Example 1 was measured.

A black adhesive tape was attached on a glass having little light absorption, and the optical multilayer film specimen was attached thereon. The reflectance was measured in a wavelength band of 400 nm to 800 nm using a spectrophotometer (U-4100, Hitachi, Ltd.).

Further, the same procedure as in Example 1 was repeated, except that optical multilayer films were produced by changing the thickness of any one of the layers, as follows.

Specifically, various optical multilayer films were prepared under the following conditions (a) to (d), and the reflectance for each was measured, which is shown in FIGS. 3a to 3d, respectively.

(a) the thickness of the primer layer was changed from 45 nm to 105 nm (b) the thickness of the hard coat layer was changed from 0.5 μm to 3.5μm (c) the thickness of the first refractive layer was changed from 10 nm to 100 nm (d) the thickness of the second refractive layer was changed from 60 nm to 140 nm As shown in FIGS. 3a to 3d, the reflectance of the optical multilayer film was generally at a low level in the visible light region. Meanwhile, it was found that the reflectance was affected by the changes in thickness of each layer. In particular, the reflectance greatly changed with respect to the changes in thickness of the primer layer and in thickness of the second refractive layer.

Test Example 2: Evaluation of the Base Layer

The procedure of step (1) of Example 1 was repeated, except that a polyester-type base layer was obtained in accordance with the following specific preparation process conditions.

TABLE 2

| | Process conditions for base layers | | | | | |
|---|---|---|---|---|---|---|
| Item | Thickness (μm) | MD Stretch ratio | TD Stretch ratio | MD stretch ratio/TD stretch ratio | Preheating (° C.) | Heat setting (° C.) |
| Base layer 1 | 40 | 3.3 times | 3.5 times | 0.94 | 78 | 180 |
| Base layer 2 | 40 | 3.1 times | 3.4 times | 0.91 | 78 | 230 |
| Base layer 3 | 50 | 3.1 times | 3.4 times | 0.91 | 78 | 230 |
| Base layer 4 | 30 | 3.1 times | 3.4 times | 0.91 | 78 | 230 |
| Base layer 5 | 50 | 3.2 times | 4.2 times | 0.76 | 78 | 230 |
| Base layer 6 | 80 | 1.2 times | 4.3 times | 0.28 | 78 | 210 |

The six base layer specimens were tested, as follows.

(1) Refractive Index and in-Plane Retardation

The refractive index ((Nx+Ny)/2), the in-plane retardation (Ro), the thickness direction retardation (Rth), and the in-plane retardation (|ΔRo|/|Δx|) within the effective width were measured for the samples.

First, the orientation axis direction of the sample was obtained with two polarizing plates. The sample was cut into a rectangle of 4 cm×2 cm such that the orientation axis directions were orthogonal. The in-plane retardation (Ro) and the thickness direction retardation (Rth) were measured at the width center using a phase difference meter (Axoscan, Axometrics, measurement wavelength: 550 nm). In addition, the refractive index as a basic data of the retardation meter was measured by Abbe refractometer (NAR-4T, Atago Co., Ltd., measurement wavelength: 589.3 nm); and the thickness d (μm) was measured with an electronic micrometer (Millitron 1245D, Feinpruf GmbH). The results are shown in Table 3 below.

TABLE 3

| | Retardation of base layer | | |
|---|---|---|---|
| Item | Ro (nm) | Rth (nm) | |ΔRo|/|Δx| (nm/3 m) |
| Base layer 1 | 58 | 8,752 | 300 |
| Base layer 2 | 60 | 6,754 | 297 |
| Base layer 3 | 81 | 8,325 | 315 |
| Base layer 4 | 105 | 5,600 | 270 |
| Base layer 5 | 1,906 | 10,294 | 420 |
| Base layer 6 | 8,050 | 7,123 | 100 |

\* Ro and Rth are the values measured at the width center.
\* |ΔRo|/|Δx| = [maximum value − minimum value] of Ro within the effective width of 3 m (center ± 1,500 mm)

As shown in the above table, the base layers 1 to 3 had very small in-plane retardations, whereas the base layers 5 and 6 had large in-plane retardations.

(2) Measurement of Retardations in the Overall Effective Width of the Base Layer The in-plane retardation (Ro) and the thickness direction retardation (Rth) in the overall effective width of the base layer 1 were measured.

FIG. 4a is the results of measuring the in-plane retardation (Ro) in the overall effective width for the base layer 1. As shown in FIG. 4a, the base layer 1 had the following physical properties.

The in-plane retardation (Ro) at the width center was 100 nm or less.

The in-plane retardation (Ro) within a distance of ±500 mm from the width center in the transverse direction was 100 nm or less.

The in-plane retardation (Ro) within a distance of ±1,000 mm from the width center in the transverse direction was 200 nm or less.

The change (|ΔRo|/|Δx|) in in-plane retardation with respect to a displacement in the transverse direction within the effective width was less than 300 nm/3 m.

FIG. 4b is the results of measuring the thickness direction retardation (Rth) in the overall effective width for the base layer 1. As shown in FIG. 4b, the base layer 1 had the following physical properties.

The thickness direction retardation (Rth) at the width center was 8,600 nm or more.

The change (|ΔRth|/|Δx|) in thickness direction retardation with respect to a displacement in the transverse direction within the effective width was less than 1,500 nm/3 m.

(3) Measurement of Physical Properties

Various physical properties of the base layers 1 to 6 were measured.

The crystallinity was calculated according to the following equation.

$$Xc[\%]=dc(d-da)/d(dc-da)*100$$

(Xc: crystallinity, dc: density of crystalline part (g/cm$^3$), da: density of amorphous part (g/cm$^3$), and d: density at the measurement point (g/cm$^3$) where dc=1.455 (g/cm$^3$) and da=1.335 (g/cm$^3$))

The pencil hardness was measured using a pencil hardness tester (Kipae E & T, KP-M5000M) with a Mitsubishi 'UNI' Grade Pencil.

The tensile modulus was measured by a universal testing machine (4485 TIC960203-97B1A, Instron).

The visibility was evaluated according to the following criteria depending on the occurrence of wave pattern and glitter phenomenon.

○: no deterioration in visibility, Δ: slight deterioration in visibility, x: significant deterioration in visibility The results are shown in the Table below.

TABLE 4

| Item | Density of base layer (g/cm$^3$) | Crystallinity of base layer | Tensile modulus of base layer (at 85° C.) MD (GPa) | TD (GPa) | Visibility of base layer Longitudinal direction | Transverse direction |
|---|---|---|---|---|---|---|
| Base layer 1 | 1.388 | 44% | 3.7 | 3.8 | ○ | ○ |
| Base layer 2 | 1.397 | 52% | 3.7 | 4.0 | ○ | ○ |
| Base layer 3 | 1.397 | 52% | 3.8 | 3.9 | ○ | ○ |
| Base layer 4 | 1.398 | 53% | 4.0 | 4.1 | x | Δ |
| Base layer 5 | 1.405 | 58% | 3.8 | 4.2 | ○ | ○ |
| Base layer 6 | 1.397 | 43% | 2.2 | 5.8 | x | ○ |

As shown in the above table, the base layers 1 to 3 had excellent optical properties and excellent mechanical properties.

The invention claimed is:

1. An optical multilayer film, which comprises a laminate in which a base layer, a primer layer, a hard coat layer, a first refractive layer, and a second refractive layer are sequentially laminated,
   wherein the primer layer has a thickness of 80 nm to 95 nm, and the hard coat layer has a thickness of 1 μm to 5 μm,
   wherein the base layer comprises a polyester resin and has an in-plane retardation (Ro) of 0 to 500 nm, a thickness direction retardation (Rth) of 5,000 to 16,000 nm and a minimum in-plane retardation (Ro$_{min}$) of 85 nm or less,
   wherein Ro$_{min}$ is the lowest value when Ro is measured at a plurality of points in the plane of the base layer of the optical multilayer film,
   wherein when the refractive indices of the base layer, the primer layer, the hard coat layer, the first refractive layer, and the second refractive layer are n1, n2, n3, n4, and n5, respectively, they satisfy the following Equations (1) to (4):

$$1.61 \leq n1 \leq 1.69 \quad (1)$$

$$n5 < n3 < n2 < n1 < n4 \quad (2)$$

$$0.05 \leq n1-n3 \leq 0.20 \quad (3)$$

$$0.30 \leq n4-n5 \leq 0.60 \quad (4),$$

wherein n4 is in a range of 1.70 to 1.80, and n5 is in a range of 1.10 to 1.40, and wherein the optical multilayer film has a reflectance of 6.5% or less with respect to light having a wavelength of 550 nm.

2. The optical multilayer film of claim 1, wherein the base layer has a refractive index (n1) of 1.63 to 1.68, and
   the primer layer has a refractive index (n2) of 1.54 to 1.62.

3. The optical multilayer film of claim 2, wherein the primer layer has a refractive index (n2) of 1.55 to 1.61.

4. The optical multilayer film of claim 2, wherein the first refractive layer has a refractive index (n4) of 1.70 to 1.75.

5. The optical multilayer film of claim 2, wherein the second refractive layer has a refractive index (n5) of 1.25 to 1.35.

6. The optical multilayer film of claim 2, wherein the primer layer has a refractive index (n2) of 1.55 to 1.61,
   the hard coat layer has a refractive index (n3) of 1.50 to 1.53,
   the first refractive layer has a refractive index (n4) of 1.70 to 1.75, and
   the second refractive layer has a refractive index (n5) of 1.25 to 1.35.

7. The optical multilayer film of claim 1, the second refractive layer has a thickness of 80 nm to 120 nm.

8. The optical multilayer film of claim 1, wherein the base layer has a thickness of 20 μm to 60 μm.

9. The optical multilayer film of claim 8, wherein:
   the first refractive layer has a thickness of 5 nm to 150 nm, and
   the second refractive layer has a thickness of 80 nm to 120 nm.

10. The optical multilayer film of claim 1, wherein the base layer has a refractive index (n1) of 1.63 to 1.68 and a thickness of 20 μm to 60 μm, the primer layer has a refractive index (n2) of 1.54 to 1.62, the hard coat layer has a refractive index (n3) of 1.50 to 1.53, the first refractive layer may have a has a refractive index (n4) of 1.70 to 1.75 and a thickness of 5 nm to 150 nm, and the second refractive layer a has a refractive index (n5) of 1.25 to 1.35 and a thickness of 80 nm to 120 nm.

11. The optical multilayer film of claim 1, wherein the base layer comprises a polyethylene terephthalate-based resin,
   the primer layer comprises a thermosetting polyurethane-based resin,
   the hard coat layer comprises a photocurable acrylate-based resin,
   the first refractive layer comprises titanium oxide (TiO$_2$) or zirconium oxide (ZrO$_2$), and
   the second refractive layer comprises silica fine particles.

12. An optical component, which comprises a polarizer; and the optical multilayer film of claim 1 disposed on at least one side of the polarizer.

13. A display device, which comprises a display panel; and the optical component of claim 12 disposed on at least one of the upper and lower sides of the display panel.

* * * * *